United States Patent [19]

Shiozawa

[11] Patent Number: 5,389,570
[45] Date of Patent: Feb. 14, 1995

[54] METHOD OF FORMING BORON DOPED SILICON LAYER AND SEMICONDUCTOR

[75] Inventor: Junichi Shiozawa, Tokyo, Japan

[73] Assignee: Kabushiki Kaisha Toshiba, Kanagawa, Japan

[21] Appl. No.: 931,787

[22] Filed: Aug. 18, 1992

[30] Foreign Application Priority Data

Aug. 19, 1991 [JP] Japan .................. 3-207045
Mar. 26, 1992 [JP] Japan .................. 4-068880

[51] Int. Cl.$^6$ ............................. H01L 21/20
[52] U.S. Cl. ........................ 437/101; 437/29; 437/46; 437/193; 437/195; 437/248; 437/141; 427/248.1
[58] Field of Search ............ 437/101, 195, 193, 46, 437/29, 141; 148/248, DIG. 3; 427/248.1

[56] References Cited

U.S. PATENT DOCUMENTS

| | | | |
|---|---|---|---|
| 4,363,828 | 12/1982 | Brodsky et al. | 427/39 |
| 4,631,198 | 12/1986 | Kakinuma et al. | 427/38 |
| 4,634,605 | 1/1987 | Wiesmann | 427/249 |
| 4,683,146 | 7/1987 | Hirai et al. | 427/54.1 |
| 4,721,664 | 1/1988 | Shimizu et al. | 430/128 |
| 5,019,527 | 5/1991 | Ohshima et al. | 437/195 |
| 5,151,383 | 9/1992 | Meyerson et al. | 437/101 |
| 5,227,329 | 7/1993 | Kobayashi et al. | 437/101 |

FOREIGN PATENT DOCUMENTS

| | | |
|---|---|---|
| 0030638A1 | 11/1980 | European Pat. Off. . |
| 0125318A1 | 11/1983 | European Pat. Off. . |
| 0143701A1 | 11/1984 | European Pat. Off. . |
| 2100759A | 12/1978 | United Kingdom . |
| 2087930A | 10/1981 | United Kingdom . |

*Primary Examiner*—R. Bruce Breneman
*Assistant Examiner*—Ramamohan Rao Paladugu
*Attorney, Agent, or Firm*—Finnegan, Henderson, Farabow, Garrett & Dunner

[57] ABSTRACT

A semiconductor layer forming method including depositing a boron doped amorphous silicon layer on a substrate having many steps, projections or cavities, by thermal decomposition of a higher order silane gas and diborane gas at 150°–450° C. The diborane gas is supplied to the substrate in a reaction limited.

25 Claims, 14 Drawing Sheets

METHOD OF FORMING BORON DOPED SILICON LAYER AND SEMICONDUCTOR

BACKGROUND OF THE INVENTION

1. Field of the Invention

The present invention relates to a method of forming a semiconductor layer and to a method of manufacturing a semiconductor device using the layer forming method. More particularly, the invention relates to a method for forming a boron doped amorphous or polysilicon layer or filler.

2. Description of the Related Art

Recent developments in high density integrated semiconductor devices such as DRAMs, for example, have required a corresponding increase in the density of electric circuit conductor elements and connectors used in the devices. For example, electrical conductor elements are formed in multiple layers, the conductor elements in one layer being insulated from those of an adjacent layer, for reduction in the area of DRAMS.

As a result of the multiple conductor element layers, many steps, projections or cavities are present on a substrate to be covered by material. Accordingly, materials used for the covering layers are required to provide good step coverage and be capable of application with uniform thickness. These characteristics are needed both for covering projections from the substrate and for materials used to fill a contact hole for electrical connection of overlying conductor wires or layers.

A boron doped polysilicon, formed by a thermal decomposition of silane ($Si_1H_4$) and diborane ($B_2H_6$), is conventionally used for such filling materials. The temperature during formation is usually kept to be about 500°–600° C., such that $SiH_4$ can be decomposed. That is, $SiH_4$ gas itself cannot be decomposed below that range of temperatures. The boron doped polysilicon is also used as electrodes of LSI, in addition to use as filling material, because the layer, formed by the thermal decomposition of these materials, has a good step coverage. For example, it is possible to fill the contact holes satisfactorily even if the contact hole has an aspect ratio (depth of groove/width of groove) more than 1. Also, the layer is free of voids after the formation. Further, the layer has a characteristic of low resistivity required by the devices.

The method of forming the boron doped layer as the filling material may be understood by reference to FIGS. 1(a)–1(d) of the accompanying drawings.

As shown in FIG. 1(a), a contact hole 100 is formed in a $SiO_2$ layer 102 so as to expose a diffusion layer 104, formed on a silicon substrate 108. A gate electrode 106 is formed on the substrate 108 through a gate insulating layer 110. Moreover, a 50 nm thick titanium layer 112 and a 20 nm thick TiN layer 116 are formed on the $SiO_2$ layer 102 and the diffusion layer 104. After formation, the layers 112 and 116 are annealed in a $N_2$ atmosphere at 600° C. for about 30 minutes, so as to form a 70 nm thick $TiSi_2$ layer 114 at the interface of the diffusion layer 104 and the titanium layer 112.

As shown in FIG. 1(b), after formation of the layer 114, a boron doped polysilicon layer 118 is formed by the LPCVD method, so as to fill contact hole 100. The layer 118 is formed at a temperature of 500°–600° C. and at a pressure of 0.1 Torr, using $SiH_4$ and $B_2H_6$ as the source gas.

Thereafter, as shown in FIG. 1(c), a part of the boron doped polysilicon layer 118 formed on the $SiO_2$ layer 102 is etched back by the RIE (Reactive Ion Etching) method. The titanium layer 112 and TiN layer 116 on the $SiO_2$ layer 102 are removed at the same time.

After the etching, a 50 nm thick titanium layer 120 is formed on the whole surface of the substrate as a barrier layer against an aluminum layer to be formed. After formation, the layer 120 is annealed, at 600° C. for 30 minutes, to form a 70 nm thick $TiSi_2$ layer 122 at the interface with the polysilicon layer 118. A 20 nm thick TiN layer 124 is formed, followed by formation of the aluminum layer 126, using the sputter method, as shown FIG. 1(d).

According to this forming method, a resistivity of 3–5 m $\Omega$.cm can be obtained in the layer 118 of boron doped polysilicon without voids. However, the high temperature (500°–600° C.) required for processing the boron doped polysilicon layer 118 presents problems to the manufacturing process.

For example, an aluminum layer cannot be formed before the formation of the boron doped silicon layer 118, because it has a low melting point. A margin of the diffusion layer 104 for the expansion which is caused by the thermal process, is also needed.

Accordingly, a lower temperature for the CVD method being processed at lower temperature is required. The CVD method has disadvantages due to the manufacturing apparatus used for its practice. A vertical CVD apparatus as shown in FIG. 2 is used to make boron doped polysilicon layer, according to the CVD method.

As shown, the apparatus includes a cylindrical outer tube 11, a cylindrical inner tube 12 spaced from the outer tube, and a quartz port 14 placed in the center of the outer tube for holding a plurality of stacked substrates 18.

The temperature of the inner space of the apparatus is set to be 550° C. by a pedestal block 13.

$SiH_4$ gas and $B_2H_6$ gas are introduced from gas introducing tubes 16a, 16b of a manifold 16. A cap 17 is provided at the bottom portion of the apparatus. In the operation of the apparatus, a boron doped polysilicon layer 118 is formed on each of the substrates.

The gases are caused to flow from the lower portion of the inner tube to the upper portion thereof, so as to be supplied to each substrate in the stack and the residual gases are exhausted from the upper portion of the inner tube 12 to the lower portion of the outer tube 11. The flow of the gases is generally perpendicular to the substrates. Although a plurality of substrates can be batch-processed with the CVD apparatus, it has serious disadvantages in that (1) deviations in the resistivity of the deposited layer occur according to the positions at which the substrates are located because the concentration of boron is higher at the upper levels of gas flow than at lower levels;

(2) the thickness of the boron doped polysilicon layer also varies, depending on the position of each substrate in that the layers deposited at the upper levels are thicker than the layers deposited at the lower levels of the stack; and (3) the uniformity of the layer on the surface of each substrate also deviates in thickness, that is, the thickness at the edge portion of the substrate is greater than that at the center portion.

These deviations lead to deteriorate the performance of the device. As a result, in order to form only high quality layers, the number of the substrates to be processed at once is limited to about 25-50 substrates. Actually, it is difficult, if not impossible, to process at once more than 100 substrates according to such the CVD apparatus to obtain even low quality layers.

Another use of boron doped polysilicon is as a layer formed on the sidewall of a metallic conductor to provide good contact with a contact hole connector to connect the metallic conductor electrically to an overlying conductor element. By forming the sidewall layer, even if a contact hole for the conductor element is misaligned, the connector can be formed to have good contact with both the upper and lower conductor elements.

The processes for forming such a connection is shown in FIG. 3(a)-3(e). As shown in FIG. 3(a), an amorphous silicon layer 300 is first formed on a lower aluminum conductor layer 302 previously formed on a substrate 304 covered by an $SiO_2$ layer 306. The amorphous silicon layer 300 is etched back so as to remain on the side wall of the aluminum conductor 302 (FIG. 3(b)). After that, a $SiO_2$ layer 308 is deposited by CVD as an interlayer insulator covering on the whole surface of the substrate and to have a substantially planar upper surface by using TEOS and $O_3$ gases (FIG. 3(c)).

Then, as shown is FIG. 3(d), a contact hole 310 is formed by using a photo resist layer (not shown) as a mask, so as to expose the wire 302. Finally, and as shown in FIG. 3(e), a tungsten (W) filler is formed to provide a conductive connector 312 in the contact hole 310 by using $WF_6$ and $SiH_4$ as the source gases and an aluminum layer 314 is formed as a second conductor element on the tungsten filler 312.

In this method, the amorphous silicon layer 300 cannot be formed by using a silane ($SiH_4$) or a disilane thermal decomposition method, because the first aluminum conductor layer 302 cannot withstand the temperature of the formation, such as more than 500° C. So the amorphous silicon layer 300 is formed by the plasma CVD method, which can be carried out at temperatures below 300° C. However, the layer formed by the plasma CVD does not have good step coverage and does not remain fully on the sidewall of the first conductor element 302, as shown in FIG. 3(e). As a result, when the contact hole 310 is formed, there is a likelihood that the $SiO_2$ layer 306 becomes etched through and beyond the lower surface thereof as shown in FIG. 3(d). Therefore, good contact between the two conductors 302 and 314 is compromised and an electrical short is likely to be caused with an under conductive layer (not shown) on the substrate 304 because of the deep etch.

SUMMARY OF THE INVENTION

The first object of the invention is to provide a boron doped amorphous silicon layer, which can be formed at low temperatures with a good step coverage.

The second object of the invention is to provide a boron doped amorphous silicon layer with good uniformity in thickness within a single substrate or in each of a plurality of substrates.

The third object of the invention is to provide a boron doped amorphous silicon layer having good uniformity in resistivity.

To attain the objects of the invention, there is provided a semiconductor layer forming method which comprises: depositing a boron doped amorphous silicon layer on a substrate by using higher order silane gas at 150°-450° C.

To attain the objects of the invention, there is provided a semiconductor layer forming method which comprises: thermal-decomposing higher order silane gas and diborane gas at a temperature of 150°-450° C.; and depositing a boron doped amorphous silicon layer made by the thermal-decomposition of the gases on a substrate. As used herein and in the appended claims, the term "higher order silane gas" means a silane gas in which each molecule of the gas contains more than one silicon (Si) atom. Strictly speaking, the gas is $Si_xH_{2x+2}$ wherein $x >= 2$.

DETAILED DESCRIPTION OF THE PREFERRED EMBODIMENTS

Before describing the process embodiments of the invention, a comparison of certain characteristics of the higher order silane and boron gas mixtures of the invention with conventional silane and boron mixtures will be made with reference to FIGS. 4 and 5 to provide a more complete understanding of the invention.

Figure 4:
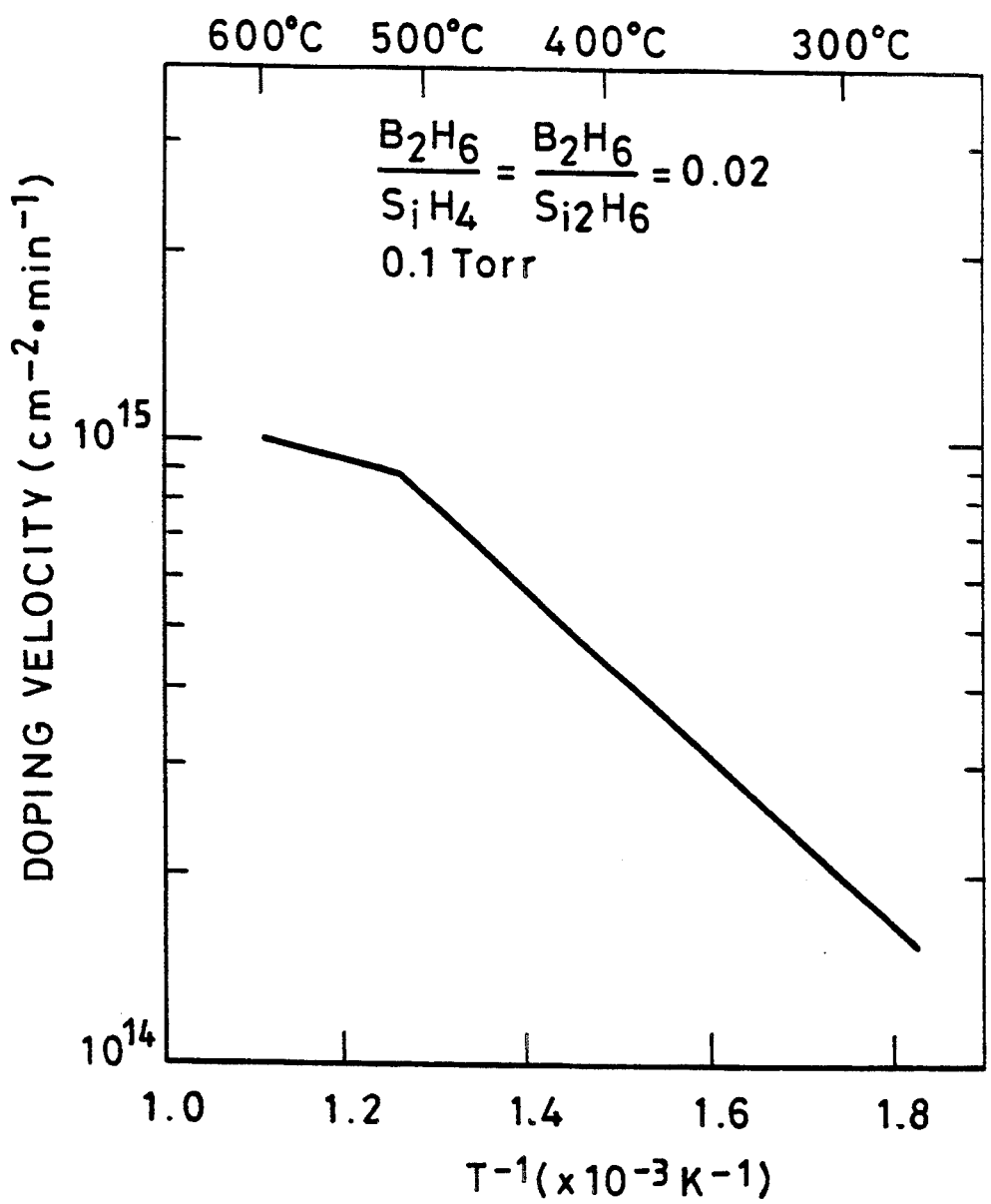
FIGS. 4 and 5 are characteristic graphs to explain the invention.

In FIG. 4, the doping velocity of the conventional $SiH_4+B_2H_6$ and a higher order $Si_2H_6+B_2H_6$ against thermal decomposition temperatures are shown. Doping velocity is the velocity at which boron is absorbed on a substrate.

The flow rate ratio of both $B_2H_6$ to $SiH_4$ and $B_2H_6$ to $Si_2H_6$, e.g., 0.02, and the doping velocity of both gases are essentially the same. Also, and as shown in the curve of the graph, both have a point of inflection at about 500° C.

As further seen in FIG. 4, a first phase of the doping velocity versus temperature plot may be defined as the region of the plot to the left of the inflection point. That is, the first phase is in temperature above 500° C. In the first phase, the slope of the plot substantially levels off such that changes in temperature yield little corresponding change in the doping velocity. The first phase may therefore be termed "supply limited" in that the rate of incorporation of dopant into the grown amorphous silicon layer is primarily determined by mass transport of reactant gases.

A second phase of the doping velocity versus temperature plot may also be defined as the region of the plot to the right of the inflection point. That is, the second phase is in temperature below 500° C. In the second phase, the slope of the plot is relatively steeper than in the first phase. Accordingly, a change in temperature in the second phase produces a corresponding change in the doping velocity. The second phase may thus be termed "reaction limited" in that the rate of incorporation of dopant is controlled by doping reaction.

As discussed above, in the vertical CVD apparatus, variations in boron concentration in the deposited amorphous silicon layers occur in higher temperatures because the gas flow at upper portions of the apparatus have a higher boron concentration than in lower portions of the apparatus. Accordingly, amorphous silicon layers deposited on wafers located in upper portions of the apparatus have a higher concentration of boron than amorphous silicon layers deposited on wafers located in lower portions of the apparatus.

According to the present invention, however, the higher order silane and diborane gases are reacted at relatively low temperatures, i.e., in the second or reaction limited phase. Thus, variations in boron concentrations in the gas flow have relatively little effect on the rate of boron incorporation (doping velocity) into, and the growth rate of the deposited amorphous silicon layer. This is because the rate of boron incorporation and the growth rate of the, deposited film are principally determined by temperature, not by the relative amounts of the reactant gases. Accordingly, amorphous silicon layers deposited on wafers located in an upper portion of the vertical CVD apparatus have substantially the same boron concentration and film thickness as wafers located in the bottom portion of the vertical CVD apparatus. As a result, large numbers of wafers may be stacked throughout the vertical CVD apparatus, each of which have substantially the same boron concentration in the amorphous silicon layers formed thereon.

Figure 5:
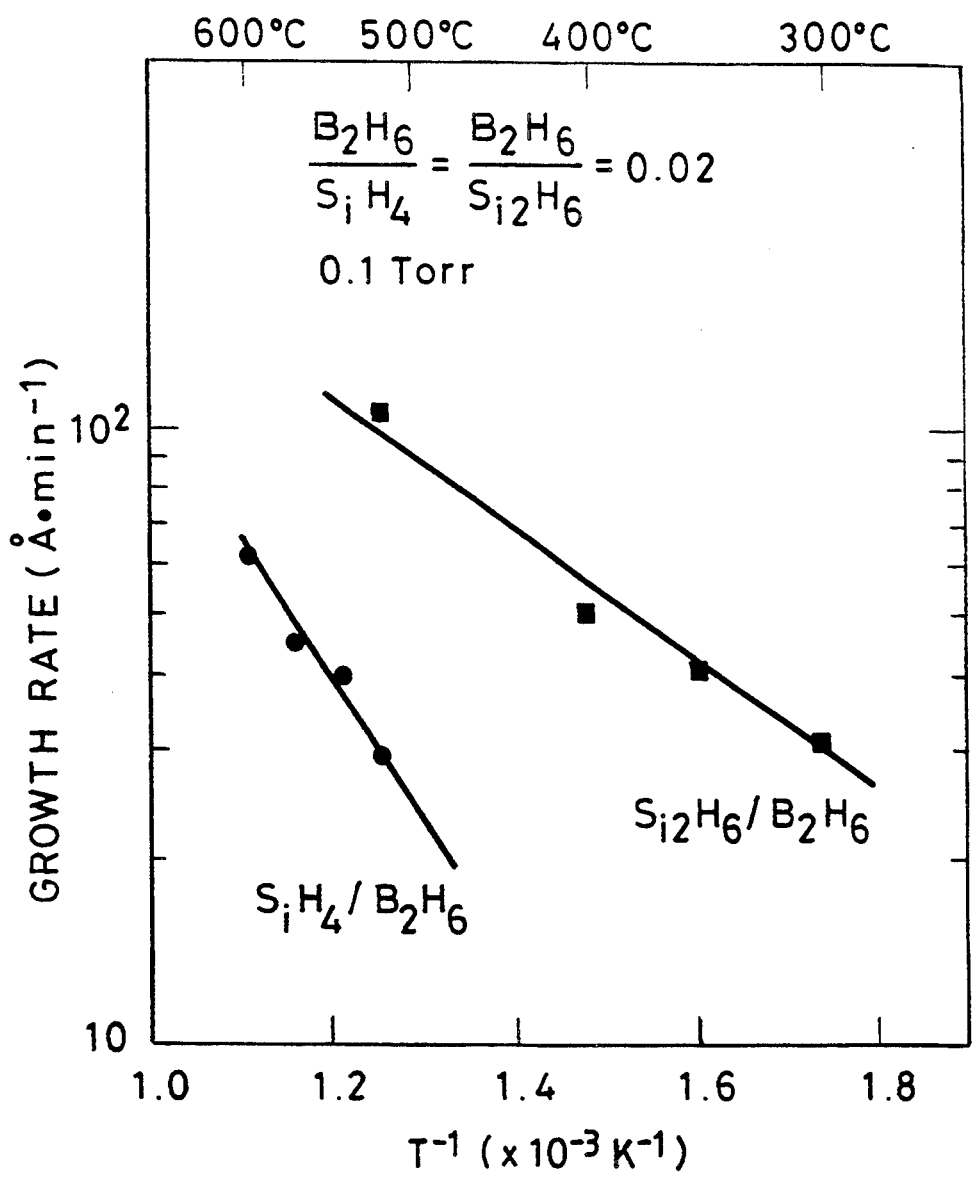

A comparison of a growth rate of boron doped amorphous silicon layers formed by $SiH_4+B_2H_6$ and $Si_2H_6+B_2H_6$, against temperature, is shown in FIG. 5. In connection with growth rate, therefore, the growth rate of $SiH_4+B_2H_6$ is inadequate at temperatures below 450° C. in practice. However, in the case of $Si_2H_6+B_2H_6$, the growth rate was adequately high for practical application even below 450° C.

In general and prior to experimentation leading to the present invention, $Si_2H_6$ was considered to be not decomposable below 400° C. However, when supplied with $B_2H_6$, as is apparent from the graph, $Si_2H_6$ can be decomposed at temperatures below 400° C.

Although the reason for such low temperature decomposition has not been established conclusively, it is believed that $B_2H_6$, which can be decomposed at lower temperatures than $Si_2H_6$, is absorbed and disassociated on the substrate, so that $Si_2H_6$ is reacted with $B_2H_6$ to promote the decomposition.

Accordingly, the boron doped amorphous silicon layer can be formed at the low temperature, which heretofore could not be considered. Moreover, at the low temperature the boron is applied to the substrate with reaction limited, so that the layer has a boron concentration and a resistivity lower than that of a phosphorous (P) or arsenic (As) doped silicon layer. In addition, the layer has a good step coverage because of the formation by the surface reaction.

The preferred process embodiments according to the invention will be described with reference to the drawings. FIG. 6(a)-(g) show successive sectional process views of a first embodiment.

Figure 6A:
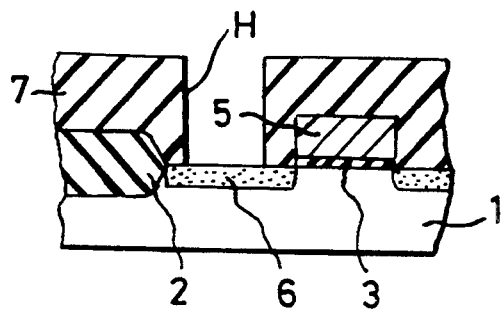
FIGS. 6(a)-6(g) are sequential sectional process views of an embodiment of the invention.

As shown in FIG. 6(a), a MOSFET, which comprises a gate electrode 5 with a gate insulating layer 3 and diffusion layers 6 as a source/drain, are formed on an n type silicon substrate 1 of 4–5 Ω cm resistivity. A field isolation layer 2 is also formed on the substrate and an $SiO_2$ layer 7 is formed as an interlayer insulator on the whole surface of the substrate. Then, a contact hole H is formed to expose one of the diffusion layers 6.

Figure 6B:
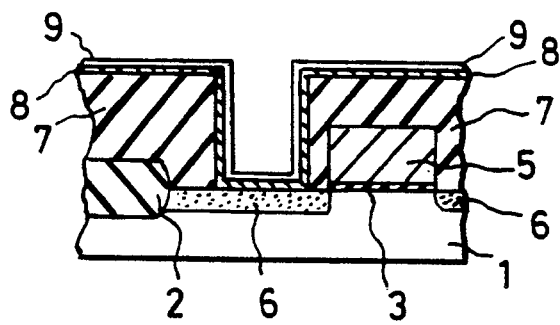

Next, as shown in FIG. 6(b), a 50 nm thick titanium layer 8 and TiN layer 9 are formed by the sputtering method or by the CVD method and an annealing step is carried out to form a $TiSi_2$ layer (not shown in the figure) at the interface of the titanium layer 8 and the diffusion layer 6.

Figure 1A:
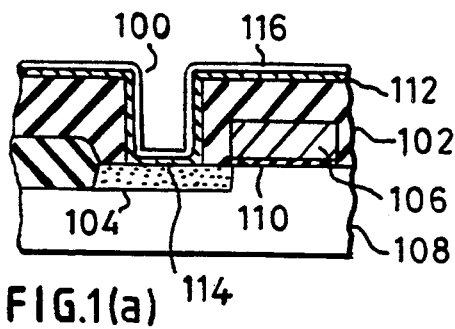
FIGS. 1(a)-1(d) show schematic sectional process views of related art.
Figure 1B:
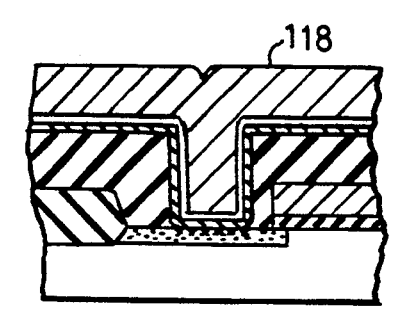
Figure 1C:
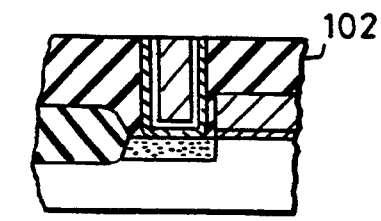
Figure 1D:
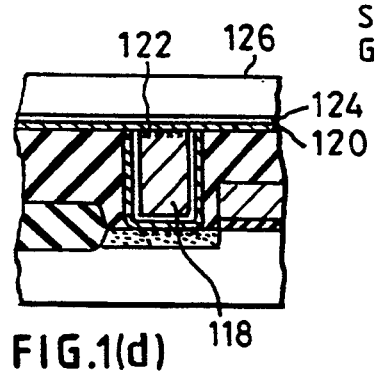
Figure 2:
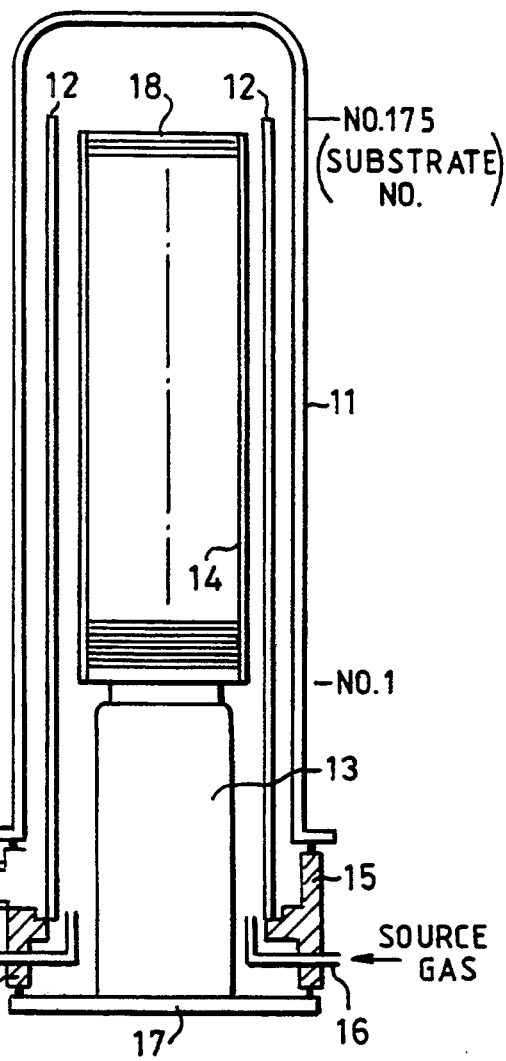
FIG. 2 shows a schematic sectional view of an LPCVD apparatus.
Figure 3A:
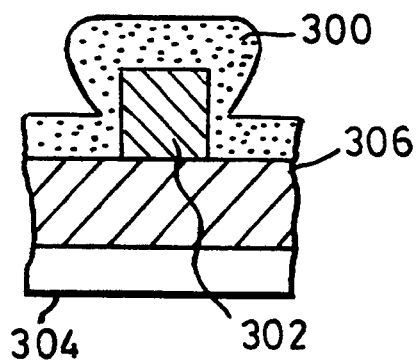
FIGS. 3(a)-3(e) show schematic sectional process views of related art.
Figure 3D:
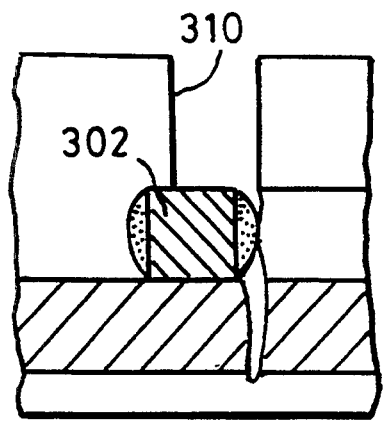
Figure 3B:
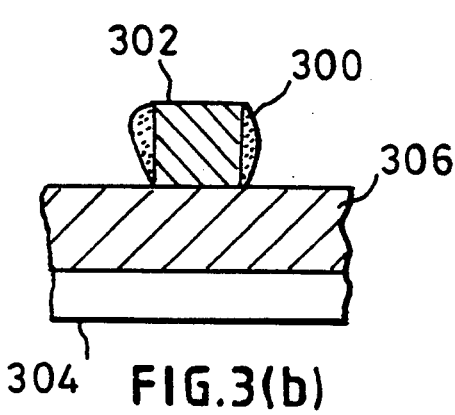
Figure 3C:
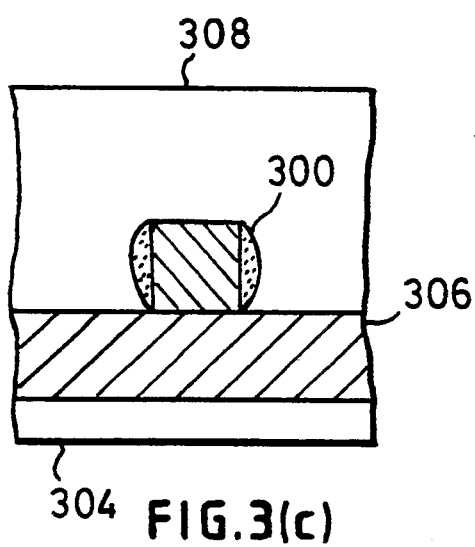
Figure 3E:
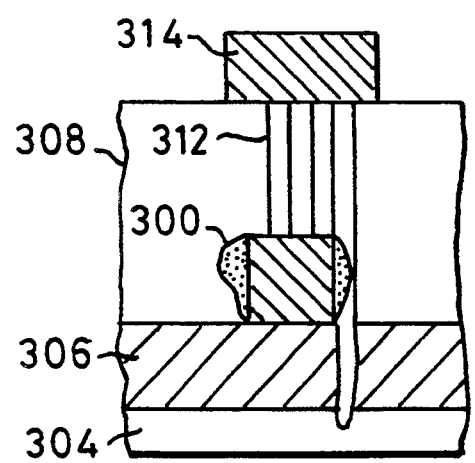
Figure 6C:
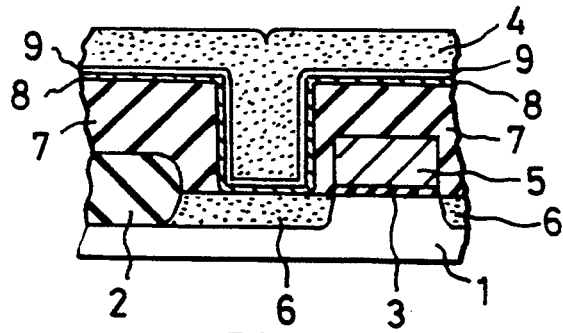
Figure 6D:
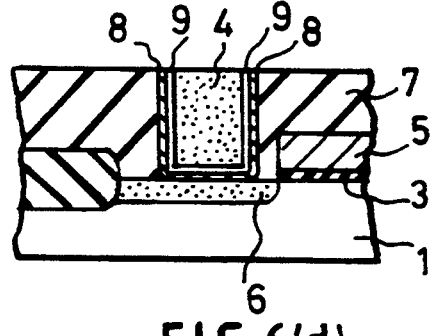

As shown in FIG. 6(c), a boron doped amorphous silicon layer 4 is formed by the LPCVD (Low Pressure Chemical Vapor Deposition) method so as to fill the contact hole H, using the LPCVD apparatus shown in FIG. 2 without appreciable change in structure. It is important to note, however, that in the embodiment, $Si_2H_6$ gas, as a higher order silane gas, and $B_2H_6$ gas are introduced from the tubes 16a, 16b respectively. Also, the temperature of decomposition is set to be about 250° C. and the pressure is 0.075 Torr.

After formation at the boron doped amorphous silicon layer 4, a part of the layer 4 is etched back by the plasma etching method or the RIE, using $CF_4$ and $O_2$. That is, the titanium layer 8 and the TiN layer 9 formed on the top surface of the $SiO_2$ layer 7 are removed (FIG. 6(d)).

Figure 6E:
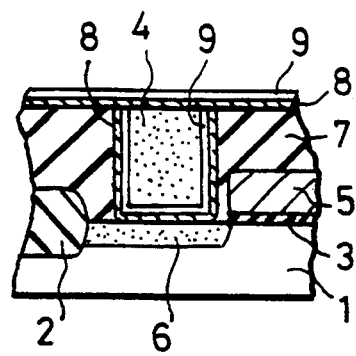
Figure 6F:
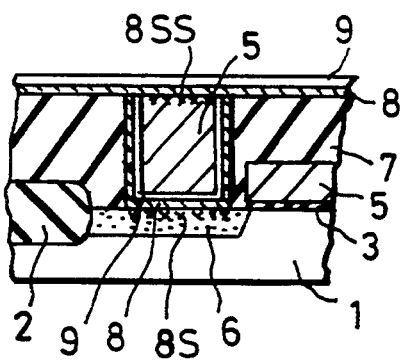

Then, a 50 nm thick titanium layer 8a and TiN layer 9a are formed on the substrate, as shown in FIG. 6(e). An annealing step is carried out in an $N_2$ gas or an Ar gas atmosphere at 500°–700° C., whereby the boron doped amorphous silicon filler formed from the layer 4 is changed to a boron doped polysilicon filler 5 as shown in FIG. 6(f). As a result of the annealing step, titanium silicide layers 8S, 8SS, are formed respectively at the interface of the diffusion layer 6 and the titanium layer 8, and at the interface of the boron doped polysilicon filler 5 and the titanium layer 8a.

Figure 6G:
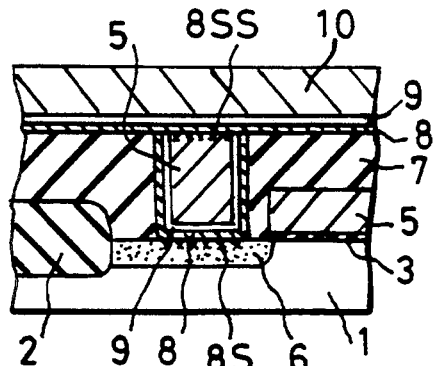

Finally, as shown in FIG. 6(g), an aluminum layer 10 is formed on the substrate by the sputtering method.

The resistivity of the boron doped polysilicon 5 formed according to the illustrated process embodiment, is below $2 \times 10^{-3}$ Ω.cm and the resistivity of the contact can be decreased, compared with the conventional process. Also, the thickness of the layer 4 (FIG.6(c)) is almost constant across wafer to wafer.

Moreover, the boron doped polysilicon layer, from which the filler 5 is formed, according to the embodiment, has characteristics of a good step coverage and an uniformity in thickness for 175 substrates at the low temperature. Thus, the number of substrates in a batch processed is increased significantly.

The temperature is set to be constant at 250° C. in the described embodiment, but it is possible to provide a temperature gradient in the apparatus shown in FIG. 2, such that lower portion is at a lower temperature than the upper portion. Accordingly, the number of substrates to be processed at one time can be increased further.

In the described embodiment, pressures of 0.01 Torr–0.2 Torr and temperatures of 200°–450° C. are practical. This has been demonstrated by experiments of the inventor.

Figure 7:
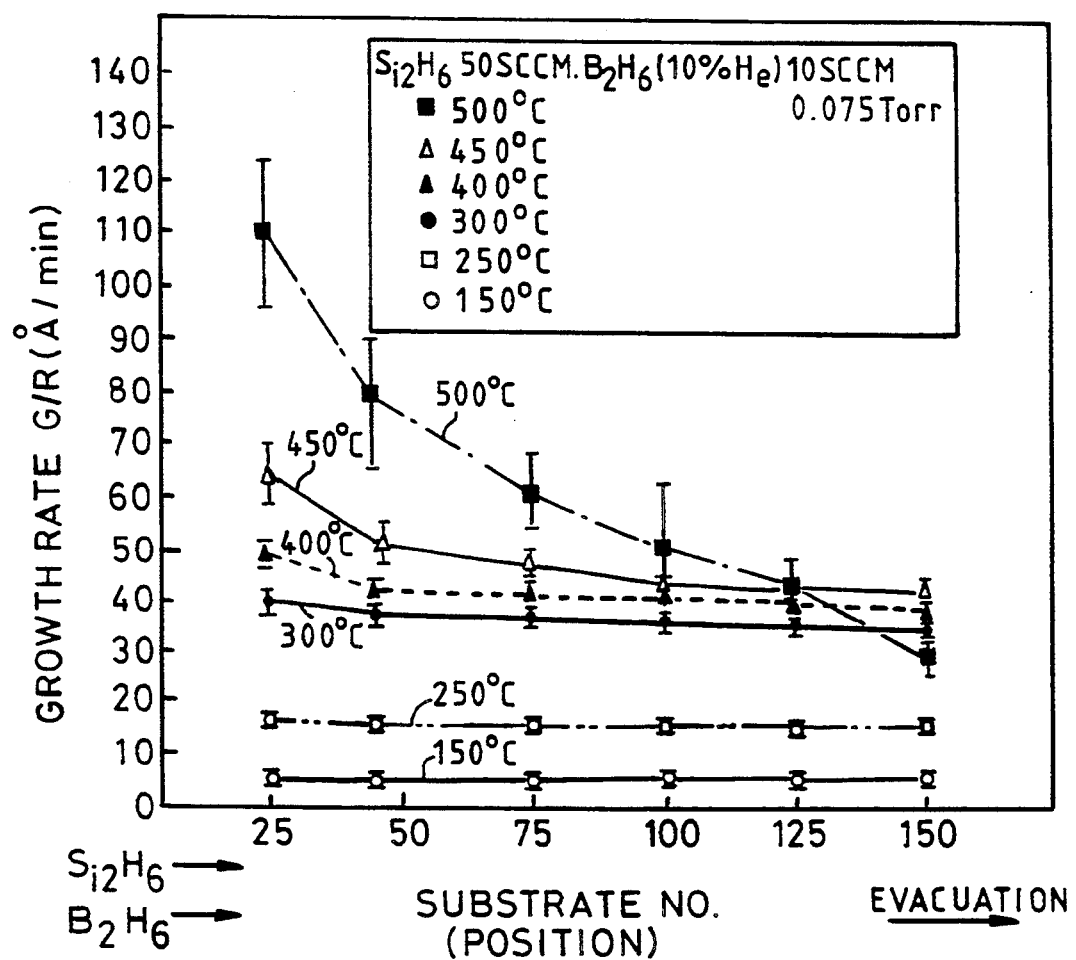
FIG. 7 is a graph representing characteristic growth rate relative to position in a plurality of stacked substrates.

As shown in FIG. 7, the growth rate (G/R) of each substrate was measured, changing the temperature in the range of from 150° C. to 500° C. 175 substrates were introduced into the apparatus as shown in FIG. 2. 50 sccm (standard cubic centimeters per minute) of $Si_2H_6$ and 10 sccm of $B_2H_6$ (added 10% $H_2$) were introduced as source gases under a pressure of 0.075 Torr. In FIG. 7, the horizontal axis is the positional number of each substrate in the apparatus. The substrate numbers on the horizontal axis are in order of the flow of the introduced gas. For example, the number 1 is at the bottom portion of the apparatus, whereas the substrate numbered 150 is near the top. The vertical axis represents growth rate. A growth rate of less than 5 Å/min is not practical at low temperature, such as below 150° C., so the measurement was made at temperatures higher than 150° C.

At temperatures of 500° C., the growth rate decreased steeply in the direction of gas flow. However, at 450° C., the change of the growth rate was suppressed. At 300° C., the growth rate leveled off. The uniformity of growth rate was notable at lower temperatures, such as 250° C., 150° C., even though the growth rate was decreased slightly.

Figure 8:
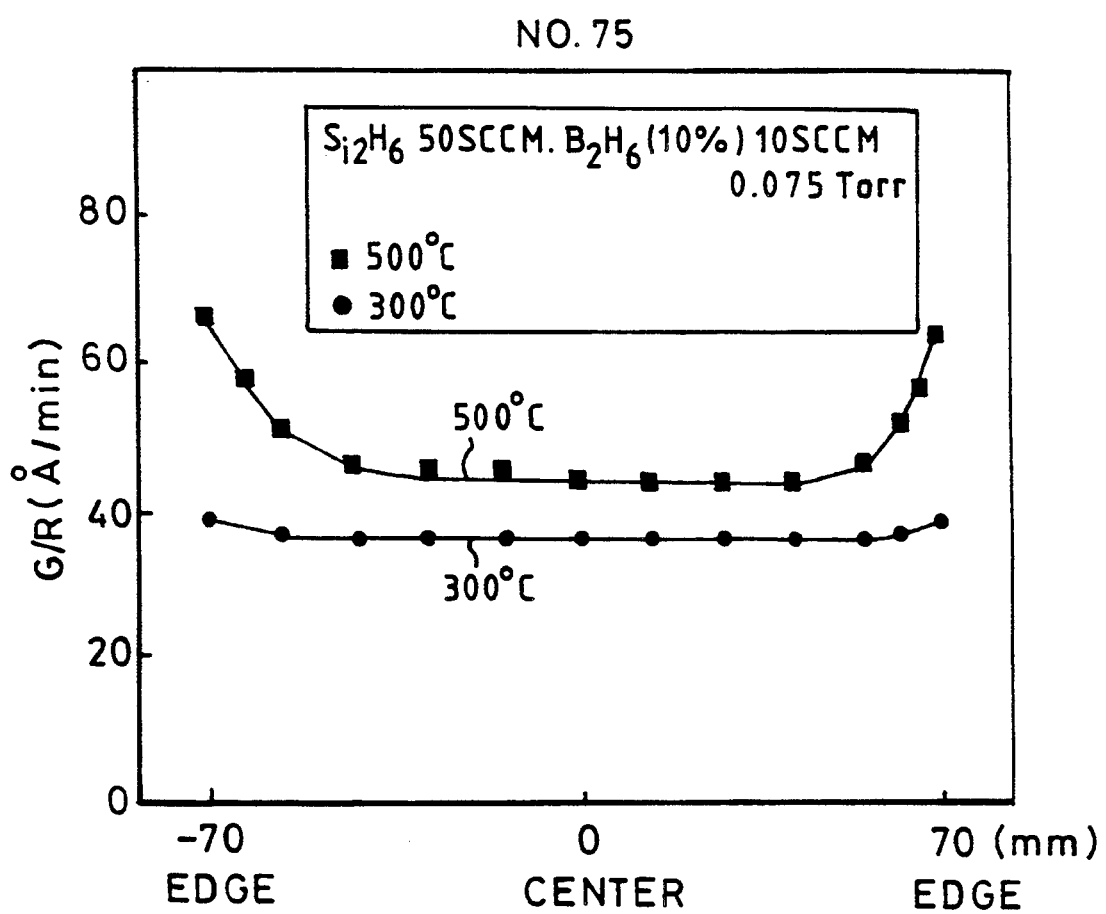
FIG. 8 shows a characteristic view of the growth rate of the embodiment.

Next, the layer thickness of each substrate was examined. The graph of FIG. 8 represents thickness variations of substrate number 75 at two temperatures, placed in the middle portion of the tube.

At 500° C., the growth rate of the edge portion −70 mm, 70 mm of the substrate was increased exceedingly relative to the center portion (0 mm). On the other hand, at 300 ° C., the growth rate was not substantially changed across the whole surface of the substrate. Therefore, the deviations in thickness were about 10% at 500° C. and almost 0% at 300° C. The layers obtained were polysilicon layer at the 500° C. and amorphous silicon at 300° C. respectively.

Figure 9:
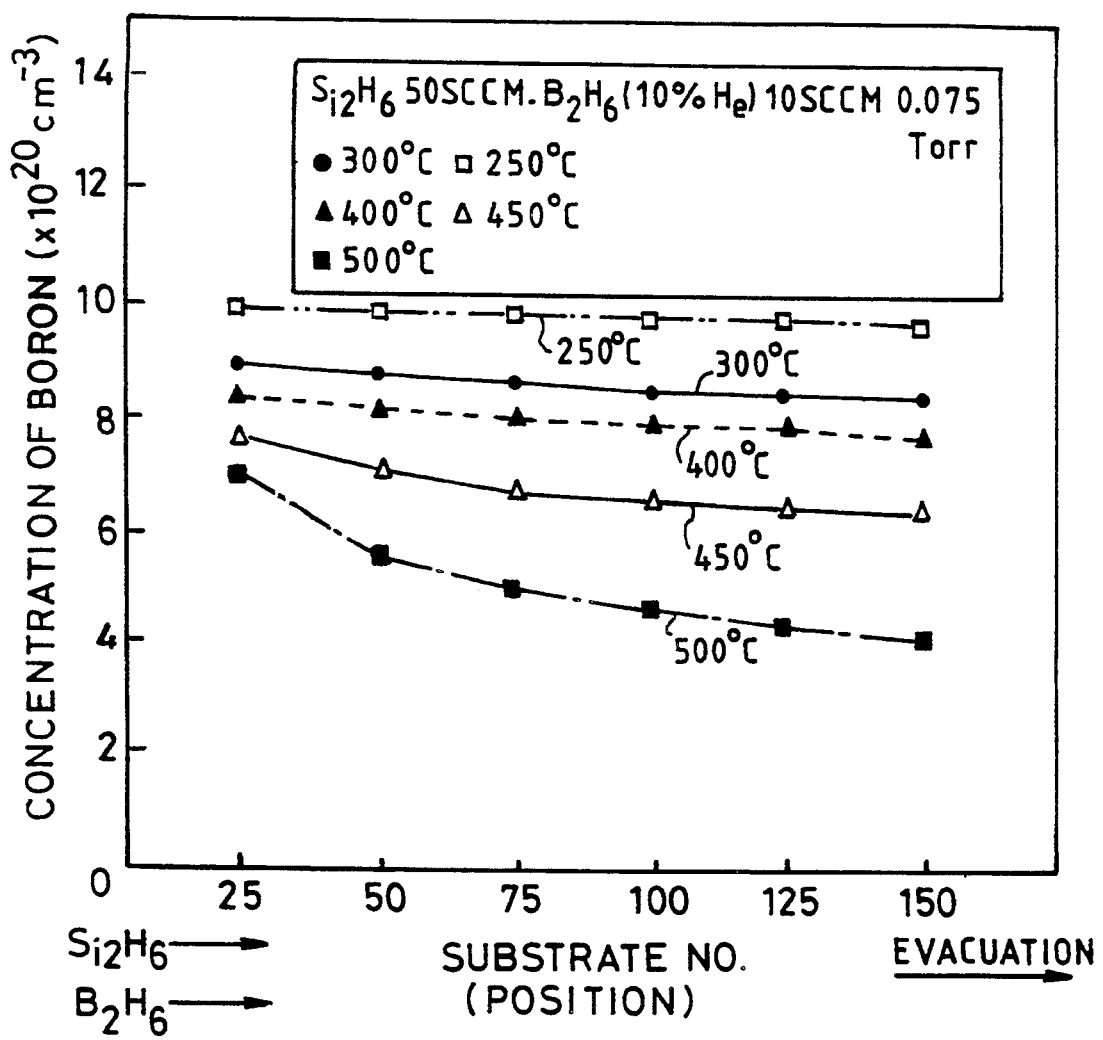
FIG. 9 is a graph showing the concentration of boron of a layer according to the invention.

Next, the boron concentration corresponding to the substrate positions were checked at temperatures in the range of 250° C.–500° C., as shown in FIG. 9.

As is apparent from FIG. 9, at 500° C. the concentration decreased steeply with direction of gas flow and the concentration of the upper stream end was about double that of the downstream end. However, at 450° C., the change of concentration was decreased conspicuously.

In the cases of 400° C., 300° C. and 250° C., little change in the concentration was present and deviation of the concentration was below 10%. Accordingly, less than 450° C. is desired for boron concentration.

Figure 10:
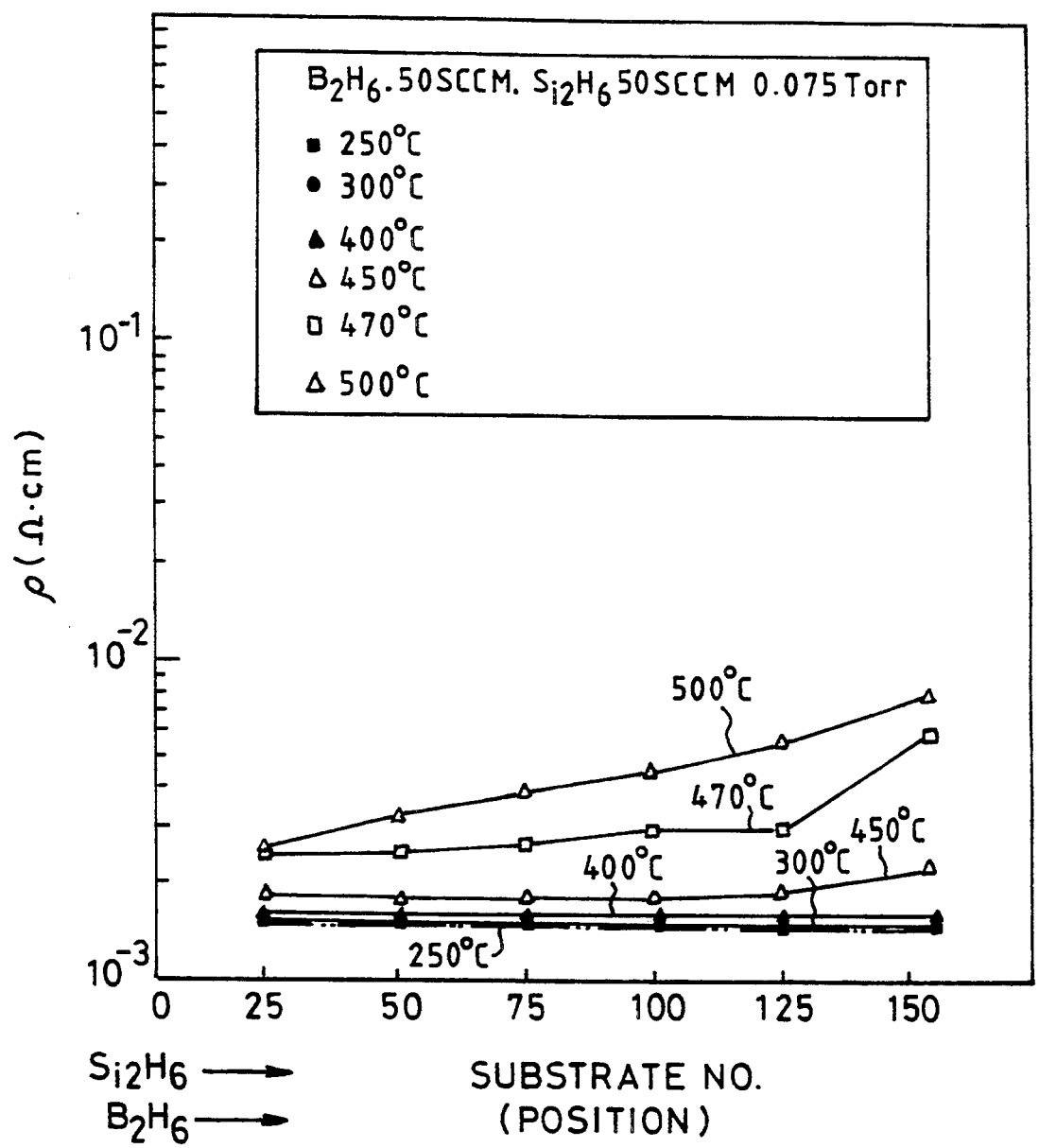
FIG. 10 is a graph showing resistivity of a layer formed according to the invention under constant pressure and different temperatures.

FIG. 10 shows the resistivity of the boron doped layer of each position. In the cases below 450° C., annealing at 600° C. was carried out for one hour for recrystallizing to change the amorphous layer to the polysilicon layer. The resistivity of each layer was then measured.

As apparent from FIG. 10, in the cases of 250° C., 300° C., 400° C., and 450° C., the resistivities were low, that is, about 1.5–2.0 m $\Omega$.cm at each position of the substrates and the deviations were below 10%. This was caused by the uniformity of the boron concentration as represented in FIG. 9.

On the other hand, at 470° C. and 500° C., the change of resistivities were notable. That is, the resistivity of the substrate located upstream in the gas flow was about 5 times larger than that of the substrate placed downstream in that flow. Also, at these higher temperatures, resistivity was not uniform and was high, such as $2.5 \times 10^{-3}$ $\Omega$.cm, even at the upstream end of gas flow.

Figure 11:
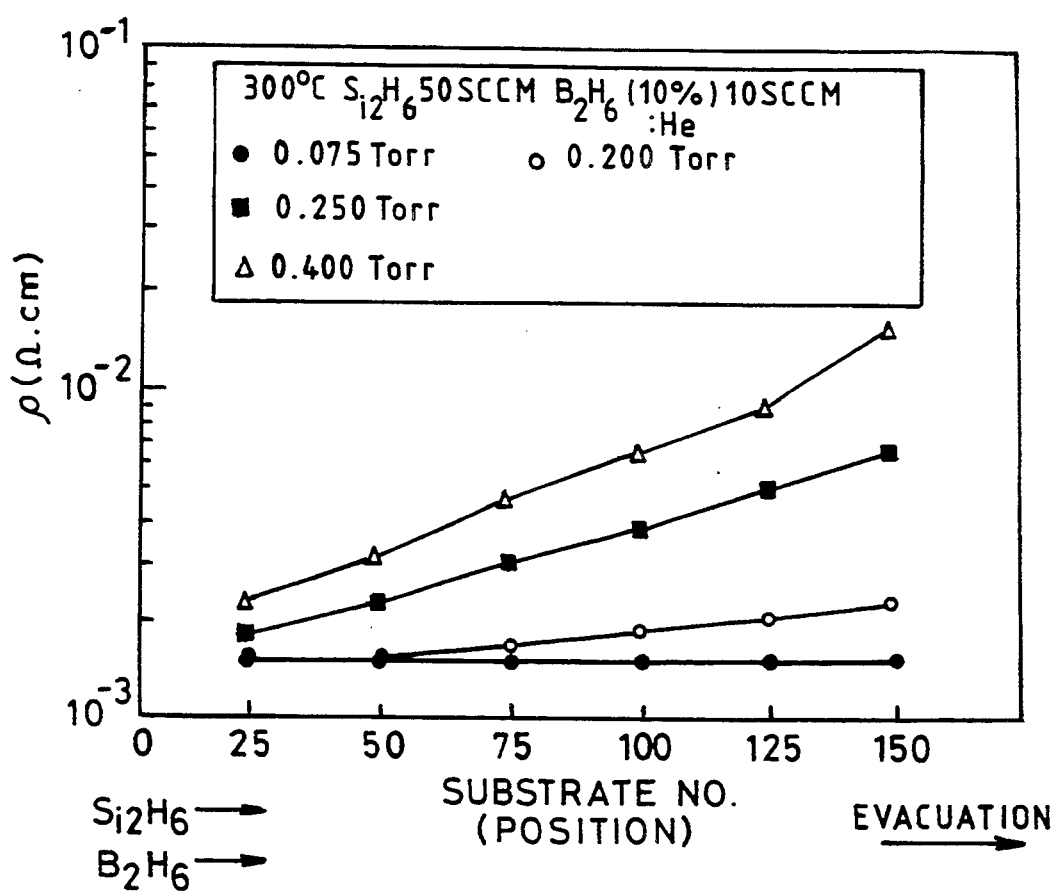
FIG. 11 is a graph showing resistivity of a layer formed under constant temperature and different pressures according to the present invention.

Also, the relationship between the resistivity and the pressure was measured. FIG. 11 shows the results. The temperature was kept at 300° C. (constant) and 50 sccm of $Si_2H_6$ and 10 sccm of $B_2H_6$ were used. The pressure was changed from 0.075 Torr to 0.4 Torr. The layers were annealed at 600° C. for one hour after the formation of the boron doped layer and then the resistivity was measured.

In the cases of 0.4 Torr and 0.25 Torr, the resistivities were increased 5 times from lowermost substrate (upstream) to highest (downstream.) That is, in these cases the layer uniformity was not good. However, at 0.2 Torr, the resistivity was slightly increased and at 0.075 Torr, it was almost stable on $1.5 \times 10^3$ $\Omega$.cm. In these low pressures, the deviation at each of the substrate positions was below 10%.

Accordingly, a good uniformity in resistivity was attained at pressures below 0.2 Torr.

Because the resistivity of the deposited layer is below $3 \times 10^{-3}$ $\Omega$.cm, the layer is fully capable of use in a 0.8 nm diameter of bit line contact of 16M DRAM .

In the described embodiment, the boron doped silicon layer is formed in the vertical CVD apparatus which can batch-process 175 substrates, but it is possible to process a single wafer by directing the flow of process gas parallel to the surface of a substrate.

Moreover, this method can be applied for a formation of a MOSFET gate electrode, a plate electrode or a storage node electrode of DRAM, which are made of boron doped silicon layer.

A second embodiment of the invention, which is applicable to sidewall conductor elements, is described with reference to FIGS. 12(a)–12(g).

Figure 12A:
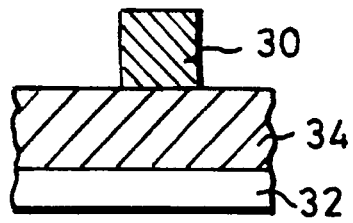
FIGS. 12(a)-12(g) show sequential process sectional views of an alternative embodiment of the invention.

As shown in FIG. 12(a), a conductor element 30 of aluminum (Al) or copper (Cu) is formed as a first conductor element on a substrate 32 through a $SiO_2$ layer 34 by the sputtering method or the CVD method and though not shown in the drawings, is patterned.

Figure 12B:
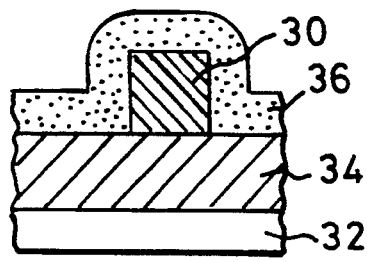

As shown in FIG. 12(b), a boron doped amorphous silicon layer 36 is formed by the thermal CVD method, the same as the method of the first embodiment described above. The layer 36 is formed at a temperature of 300° C. and at pressures of 0.01–0.2 Torr. The formation of the layer at the low temperature is possible because boron decomposed from $B_2H_6$ dominates adsorption site of $SiH_4$ or $Si_2H_4$. According to the method, boron doped silicon having good uniformity and essentially no voids can be obtained.

Figure 12C:
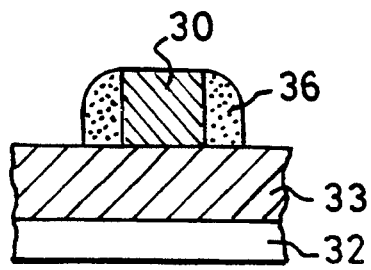

As shown in FIG. 12(c), after deposition the boron doped silicon layer 36 is etched by plasma etching or RIE (Reactive ion etching), using $CF_4$ and $O_2$ as a source gas, so that the layer will remain on the side wall of the first conductor element 30.

Figure 12D:
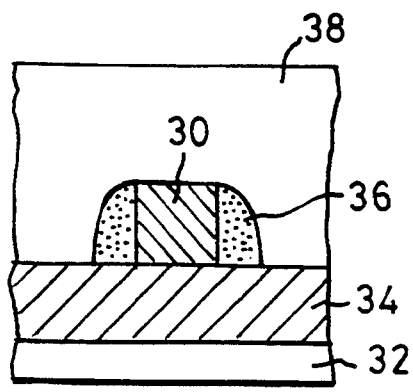

After that, as shown in FIG. 12(d), an $SiO_2$ layer 38 is deposited as an interlayer insulator on the surface of the substrate by the CVD method, by using TEOS (Si-($OC_2H_5$)$_4$) and $O_3$ so as to be planarized.

Figure 12E:
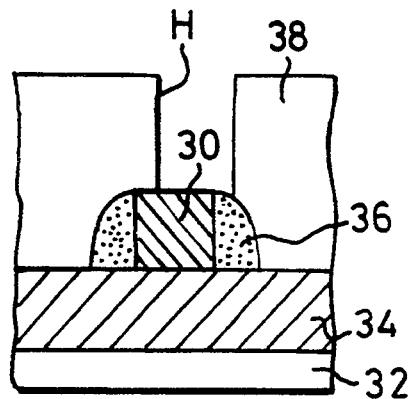

Then, as shown in FIG. 12(e), a part of the $SiO_2$ layer 38 is etched to form a contact hole H, by using a photo resist layer (not shown in the figure) as an etching mask.

In the etching steps, the desired contact hole can be formed because the boron doped silicon layer 36, retained on the side walls of the conductor element operates as an etching stopper, even if the resist pattern is formed with some alignment error.

Figure 12F:
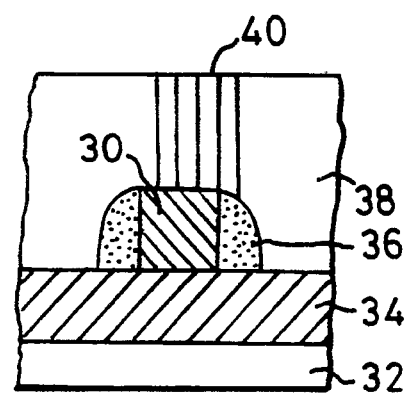

As shown in FIG. 12(f), tungsten (W) layer 40 is then selectively grown on the conductor layer 30 and the doped silicon layer 36 exposed in the contact hole, by the CVD method using $WF_6$ and $SiH_4$ gases.

Figure 12G:
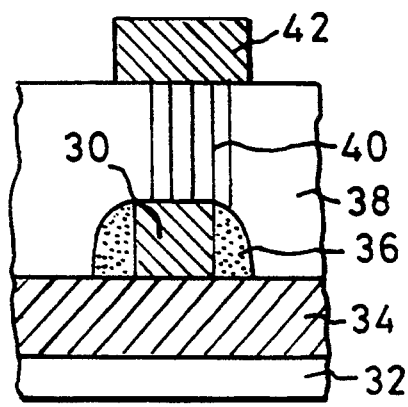

Finally, as shown in FIG. 12(g), a second conductor element layer 42 of aluminum is formed on the tungsten filler layer 40 by the sputtering method.

Figure 13:
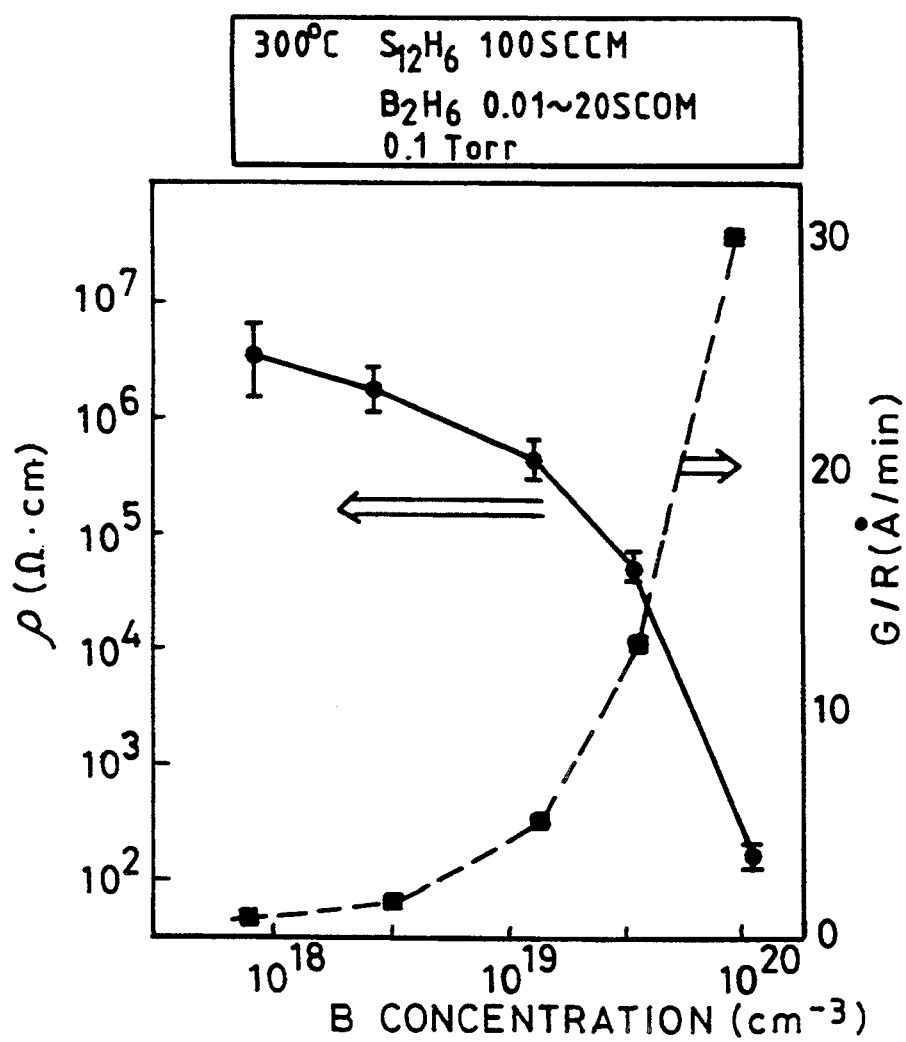
FIGS. 13 to 17 are graphs representing various characteristics of the invention.

After these steps, a reliable multilayered structure is obtained. The relations between the concentration of boron and the growth rate or the resistivity were measured, as shown in FIG. 13. In the experiment, the conditions were at 300° C., 0.1 Torr, using 100 sccm of $Si_2H_6$ and 0.01–2.0 sccm of $B_2H_6$.

The growth rate (G/R) was more than 5 Å/min when the concentration was more than $1 \times 10^{19}$ cm$^{-3}$ (100 ppm).

That is, the growth rate could be improved, provided that the concentration more than $1 \times 10^{19}$ cm$^{-3}$ was satisfied. That value can be used in practice. Also, the resistivity was decreased, accompanied with the increase of the boron concentration. The desired concentration is determined, with considering the capacitance. For example, the resistivity less than $10^5$ $\Omega$.cm is desired in this conditions, if the layer 36 is used as the side wall layer.

Figure 14:
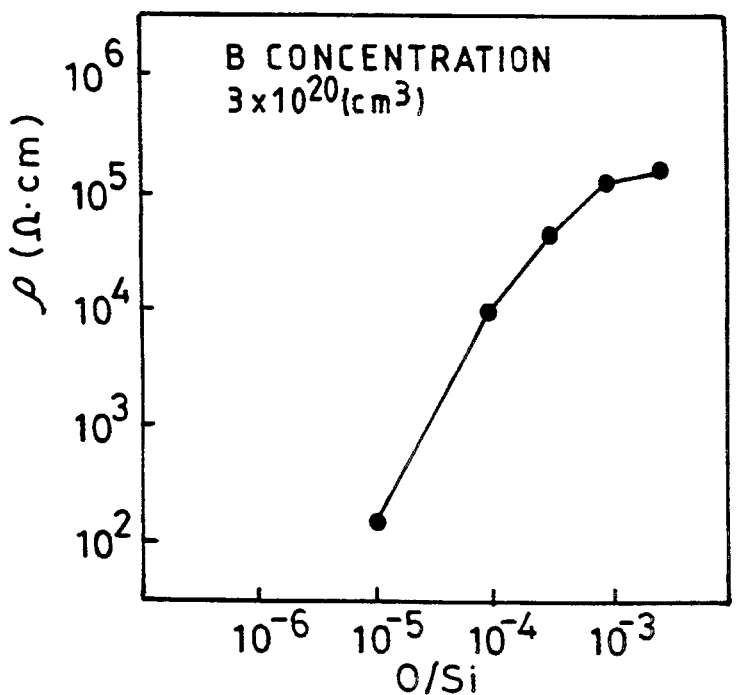
Figure 15:
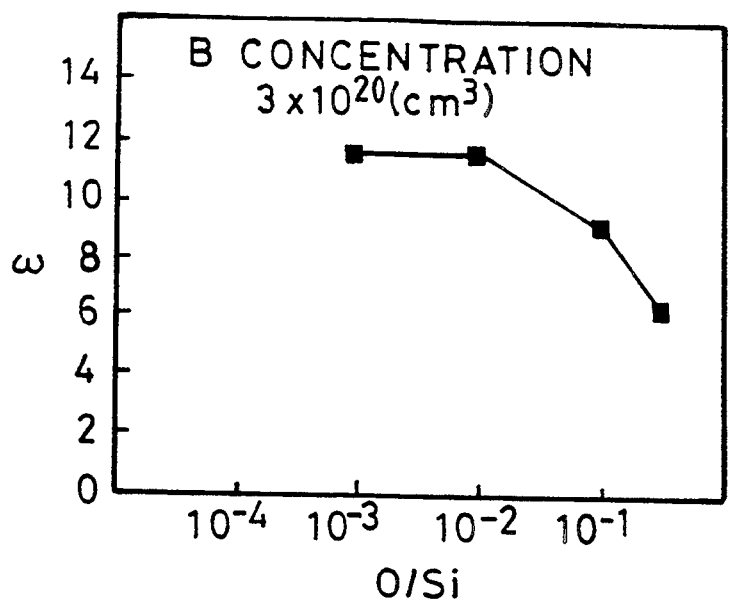

FIG. 14 shows the relationship of the resistivity ($\rho$) and the ratio of oxygen to silicon. The concentration of boron was $3 \times 10^{20}$ cm$^{-3}$. According to this graph, the amount of doped oxygen more than 100 ppm (O/Si=$10^{-4}$) could give the resistivity more than $10^4$ $\Omega$.cm. Also, as shown in FIG. 15, the concentration of oxygen more than 1% (O/Si=$10^{-2}$) could decrease the dielectric constant ($\epsilon$) rapidly. According to these facts, the capacitance among wires can be reduced by adding oxygen into the boron doped layer.

For example, in the second embodiment, the boron doped amorphous Si layer 36 is formed by adding oxygen, such that 100 sccm of $Si_2H_6$, 100 sccm of $B_2H_6$ and 0.01–10 sccm of $O_2$ are used at the conditions of 300° C., 0.1 Torr. Also, in this modification, $SiH_4$ instead of $Si_2H_6$, $N_2O$ (nitrous oxide) instead of $O_2$ can be used.

Also, as another modification of the second embodiment, the boron doped amorphous silicon layer 36 and be formed by adding nitrogen. In this case, 100 sccm of $Si_2H_6$, 20 sccm of $B_2H_6$ and 0.01–20 sccm of $NH_3$ are used under the conditions of 300° C., 0.1 Torr.

Figure 16:
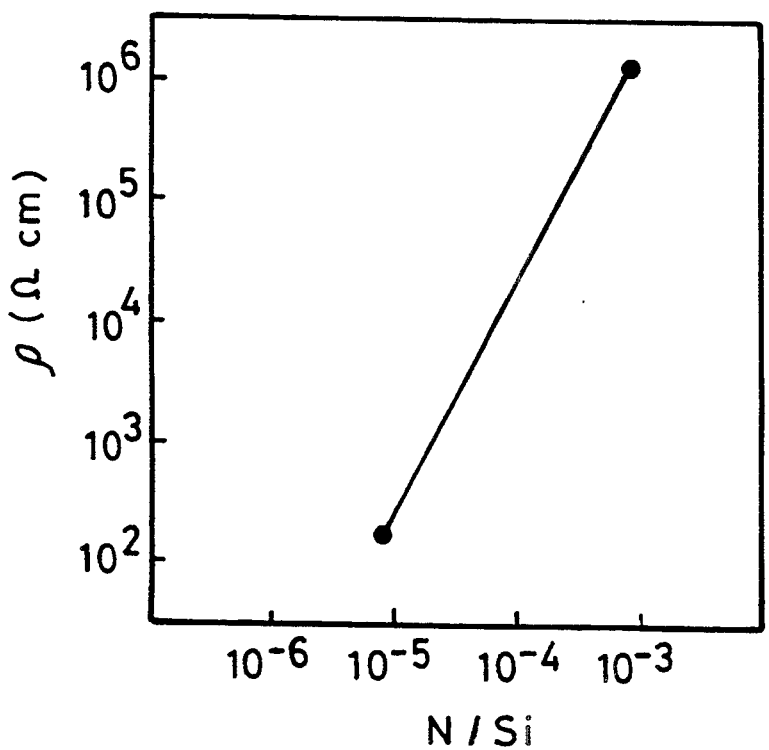
Figure 17:
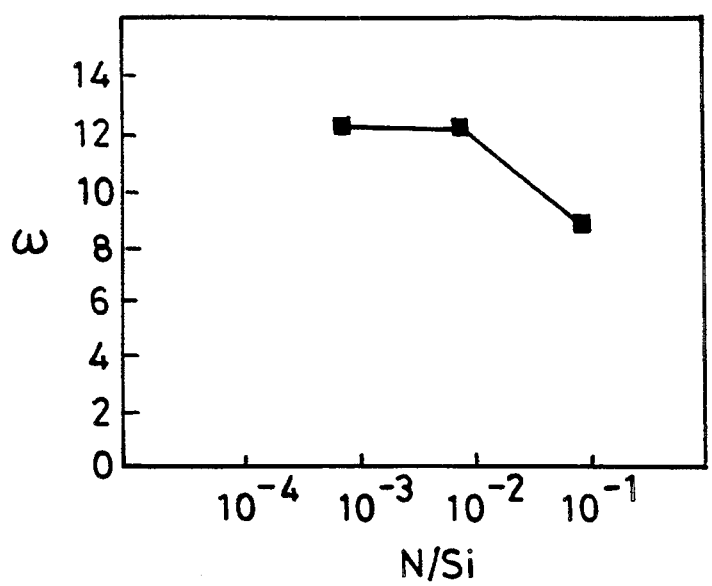

FIG. 16 is the result of measurement to show a relation between the resistivity ($\rho$) of the layer and the amount of the doped nitrogen. FIG. 17 shows a relation between the dielectric constant ($\epsilon$).

According to the results, the resistivity was increased with the doped nitrogen increase and more than $10^4$ $\Omega$.cm of the resistivity needs more than 100 ppm of nitrogen concentration. Also, the dielectric constant decreased rapidly below 0.1% of the nitrogen concentration. That is, by adding nitrogen, the good layer formed on the side wall of wire can be also attained, without the capacitance increase. In this modification, $NF_3$ can be used instead of $NH_3$. As gas containing at least one of oxygen and nitrogen can be used in the modifications.

A third embodiment of the invention, is applicable to the formation of plug electrode refilled in the DRAM trench capacitor. This embodiment uses the good step coverage characteristic according to the invention.

FIG. 18 shows successive sectional process views of the embodiment.

Figures 18A, 18B:
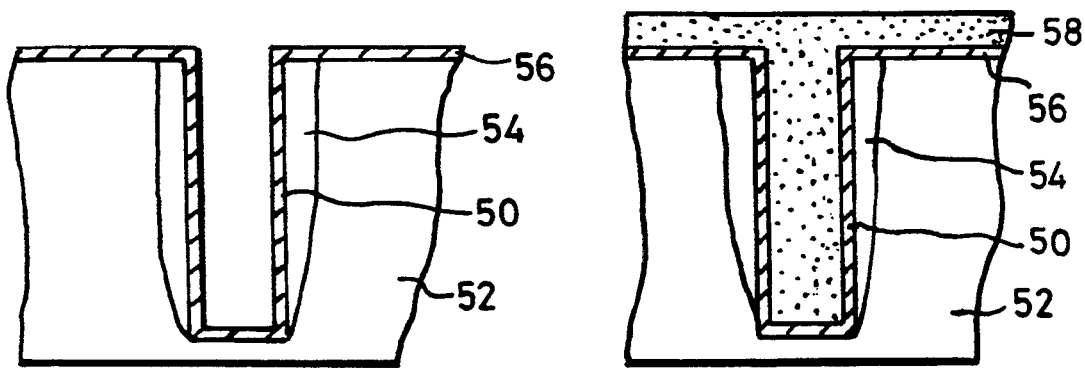
FIGS. 18(a)-18(c) are sequential process sectional views of a further embodiment of the invention.

Thus, as shown in FIG. 18(a), a trench 50 is formed in a p type silicon substrate 52 after a formation of the field insulating area (not shown in the figure). A MOSFET (not shown in the figure) is formed on the substrate, then an n type diffusion layer 54 is formed, as a storage node electrode, on the inner surface of the trench. Also, an insulating film consisting of $SiO_2$ and $Si_3N_4$ is formed on the surface of the substrate as a capacitor insulating layer 56.

After that, as shown in FIG. 18(b), a boron doped amorphous silicon layer 58 is formed by the thermal CVD method so as to refill the trench. $Si_2H_6$ and $B_2H_6$ are used as a source gas under the previously described conditions, that is, 300° C. and 0.01–0.2 Torr. The mechanism of the formation at the low temperature is similar to the first or second embodiments.

Figure 18C:
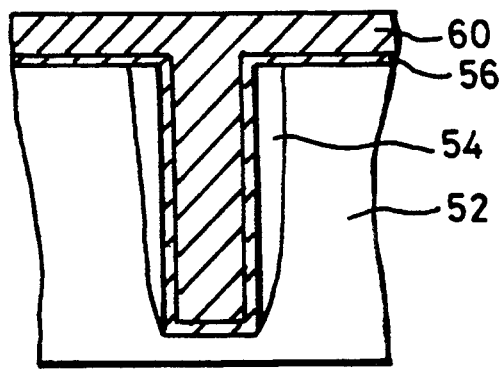

Next, as shown in FIG. 18(c), upon annealing at 500°–700° C. in $N_2$ gas or $Ar_2$ gas for 30 minutes, the amorphous silicon layer 58 is changed to the polysilicon layer 60. And the layer 60 is patterned so as to form a plate electrode.

According to these steps, the plate electrode having good uniformity and low resistivity can be obtained at the low temperature. Because the formation of the layer can be made with the good step coverage, it is possible to refill the trench having an aspect ratio more than 5. Moreover, this process is not carried out at a high temperature, so there is no need to consider the expansion of diffusion layer 54. This means it is possible to reduce the memory cell size.

In the third embodiment, the boron doped amorphous silicon layer 58 can be also used as a diffusion source to make the diffusion layer 54. Also, the storage node electrode and the plate electrode can be formed through a capacitor insulating layer in the trench. In this case, the storage node electrode can be also made by a boron doped amorphous silicon layer, in accordance with embodiments discussed above, and an annealing process can be conducted after the formation of the plate electrode. Accordingly, the annealing process can be used to change the amorphous layers to the polysilicon layers at one time, so the process step can be simplified.

As explained above, $Si_2H_6$ is used in the embodiments, but other higher order silanes, such as $Si_3H_8$ can also be used.

Also, the boron doped silicon layer according to the invention can be applied for a formation of P$^+$ gate electrode of P channel MOS transistors or gate electrode of SGT (surrounding gate transistor). According to the applications, the electrodes can be formed by the LPCVD, not by the ion implantation, such as $BF_2$. Thus, the boron diffusion into the underlying material can be suppressed.

Numerous modifications and variations of the present invention are possible in light of the above teachings. It is therefore to be understood that, within the scope of the appended claims, the present invention can be practiced in a manner other than as specifically described herein.

What is claimed is:

1. A method of forming a semiconductor device, said method comprising:

forming a boron doped amorphous silicon layer on a substrate by thermal-decomposition of a higher order silane gas and diborane gas with gas temperatures in the range of 150° C.–450° C.

2. The method of forming a semiconductor device as recited in claim 1, wherein the boron doped amorphous silicon layer is formed on each of a plurality of substrates in a batch.

3. The method of forming a semiconductor device as recited in claim 1, wherein at least one atom of oxygen, and of nitrogen are added to the thermally decomposed gases.

4. The method of forming a semiconductor device as recited in claim 1, wherein at least one of $O_2$, $N_2O$, $NH_3$, $N_2$ and $NF_3$ are added to the thermally decomposed gas.

5. The method of forming a semiconductor device as recited in claim 1, further comprising an annealing step for changing amorphous silicon layer to a polysilicon layer.

6. The method of forming a semiconductor device as recited in claim 1, wherein the thermal decomposition is at a pressure of 0.01–0.2 Torr.

7. The method of forming a semiconductor device as recited in claim 1, wherein the higher order silane gas is $Si_xH_{2x+2}$, wherein $x=>2$.

8. The method of forming a semiconductor device as recited in claim 1, wherein the higher order silane gas is at least one of $Si_2H_6$ and $Si_3H_8$.

9. A method of forming a semiconductor device comprising the steps of:
forming an insulating layer on a substrate;
etching the insulating layer to form a contact hole;
depositing a boron doped amorphous silicon layer on the substrate by thermal-decomposition of a higher order silane gas and diborane gas at temperatures of 150° C.–450° C. to refill the contact hole.

10. A method of forming a semiconductor device comprising the steps of:
forming a first conductor element on a substrate, the conductor element having a side wall;
forming a boron doped amorphous silicon layer on the substrate and the conductor element by thermal-decomposition of a higher order silane gas and diborane gas at temperatures of 150° C.–450° C.;
etching the silicon layer so that the layer remains on the side wall of the first conductor element;
forming an insulating layer on the substrate and the first conductor element including the remaining layer;
forming a contact hole in the insulating film to expose the first conductor element;
refilling the contact hole with a filler material; and
forming a second conductor element on the filler material.

11. A method of forming a semiconductor device, said method comprising:
forming a boron doped amorphous silicon layer on a substrate by using higher order silane gas and diborane gas, the gases being supplied to the substrate in reaction limited.

12. The method of forming a semiconductor device as recited in claim 11, wherein the boron doped amorphous silicon layer is formed on each of a plurality of substrates in a batch.

13. The method of forming a semiconductor device as recited in claim 11, wherein atoms of at least one of oxygen and nitrogen are added to the thermally decomposed gases.

14. The method of forming a semiconductor device as recited in claim 11, wherein at least $O_2$, $N_2O$, $NH_3$, $N_2$ and $NF_3$ are added to the thermally decomposed gases.

15. The method of forming a semiconductor device as recited in claim 11, further comprising an annealing step for changing amorphous silicon layer to a polysilicon layer.

16. The method of forming a semiconductor device as recited in claim 11, wherein the thermal decomposition is at a pressure of 0.01–0.2 Torr.

17. The method of forming a semiconductor device as recited in claim 11, wherein the higher order silane gas is $Si_xH_{2x+2}$, wherein $x=>2$.

18. The method of forming a semiconductor device as recited in claim 11, wherein the higher order silane gas is at least one of $Si_2H_6$ and $Si_3H_8$.

19. A method of forming a dynamic RAM comprising the steps of:
forming a trench on a substrate;
forming a MOSFET having source/drain region and a switching transistor on the substrate;
forming a capacitor comprising a storage node electrode connected to one of the source/drain region and a plate electrode through a capacitor insulating layer in the trench, the plate electrode being formed by thermal decomposition of a higher order silane gas and diborane gas at temperatures of 150° C.–450° C.; and
annealing the plate electrode to change the amorphous silicon to a boron doped polysilicon layer.

20. A method of forming a semiconductor device, said method comprising:
providing a chamber for reacting at least a first gas including a higher order silane gas and a second gas including diborane gas;
setting a temperature within said chamber within a range of 150° C.–450° C.; and
reacting said first and second gases to form a boron doped amorphous silicon layer.

21. The method of forming a semiconductor device as recited in claim 20, further comprising the step of placing a plurality of semiconductor substrates in the chamber such that said boron doped amorphous silicon layer is formed on at least one of said plurality of substrates.

22. The method of forming a semiconductor device as recited in claim 20, further comprising the step of introducing a third gas including at least one atom of oxygen and nitrogen into the chamber.

23. The method of forming a semiconductor device as recited in claim 20, further comprising the step of annealing said boron doped amorphous silicon layer for changing said boron doped amorphous silicon layer to a boron doped polysilicon layer.

24. The method of forming a semiconductor device as recited in claim 20, further comprising the step of setting a pressure within the chamber within the range of 0.01–0.2 Torr.

25. The method of forming a semiconductor device as recited in claim 20, wherein the first gas includes at least one of $Si_2H_6$ and $Si_3H_8$.

* * * * *